(12) United States Patent
Kuroyanagi

(10) Patent No.: US 10,665,566 B2
(45) Date of Patent: May 26, 2020

(54) SURFACE ACOUSTIC WAVE RESONATOR HAVING RING-SHAPED METAL SEALING CONFIGURATION

(71) Applicant: TAIYO YUDEN CO., LTD., Tokyo (JP)

(72) Inventor: Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 106 days.

(21) Appl. No.: 15/803,709

(22) Filed: Nov. 3, 2017

(65) Prior Publication Data

US 2018/0151534 A1 May 31, 2018

(30) Foreign Application Priority Data

Nov. 25, 2016 (JP) ................................. 2016-229453

(51) Int. Cl.
*H03H 9/05* (2006.01)
*H01L 21/52* (2006.01)
(Continued)

(52) U.S. Cl.
CPC .............. *H01L 24/83* (2013.01); *H01L 21/52* (2013.01); *H01L 23/10* (2013.01); *H01L 23/488* (2013.01);
(Continued)

(58) Field of Classification Search
CPC ......... H01L 24/83; H01L 24/12; H01L 24/26; H01L 21/52; H01L 23/488; H01L 23/5389; H03H 3/08; H03H 9/059; H03H 9/1071

See application file for complete search history.

(56) References Cited

U.S. PATENT DOCUMENTS

2011/0298111 A1* 12/2011 Kim ...................... H01L 21/561
257/660
2013/0337610 A1 12/2013 Oda et al.
2018/0269849 A1* 9/2018 Matsumoto ........ H03H 9/02637

FOREIGN PATENT DOCUMENTS

JP 2007-149902 A 6/2007
JP 2011-258920 A 12/2011
(Continued)

OTHER PUBLICATIONS

Korean Office Action dated Jan. 21, 2019, in a counterpart Korean patent application No. 10-2017-0152084. (A machine translation (not reviewed for accuracy) attached.).

*Primary Examiner* — Matthew E. Gordon
(74) *Attorney, Agent, or Firm* — Chen Yoshimura LLP

(57) ABSTRACT

An electronic component includes: a substrate; a device chip including a functional element located on a lower surface thereof and mounted on an upper surface of the substrate so that the functional element faces the upper surface of the substrate across an air gap; a ring-shaped metal layer located on the upper surface of the substrate and surrounding the device chip in plan view, a side surface of the ring-shaped metal layer being located further in than a side surface of the substrate; a metal sealing portion surrounding the device chip in plan view and bonding with an upper surface of the ring-shaped metal layer, a side surface of the metal sealing portion being located further out than the side surface of the ring-shaped metal layer; and a metal film located on the side surface of the metal sealing portion and the side surface of the ring-shaped metal layer.

8 Claims, 13 Drawing Sheets

(51) Int. Cl.
    *H01L 23/488*     (2006.01)
    *H01L 23/538*     (2006.01)
    *H03H 3/08*     (2006.01)
    *H01L 23/00*     (2006.01)
    *H01L 23/10*     (2006.01)
    *H03H 3/02*     (2006.01)
    *H03H 9/10*     (2006.01)

(52) U.S. Cl.
    CPC .......... *H01L 23/5389* (2013.01); *H01L 24/12* (2013.01); *H01L 24/26* (2013.01); *H03H 3/02* (2013.01); *H03H 3/08* (2013.01); *H03H 9/059* (2013.01); *H03H 9/0523* (2013.01); *H03H 9/0547* (2013.01); *H03H 9/1071* (2013.01)

(56) References Cited

FOREIGN PATENT DOCUMENTS

| | | | |
|---|---|---|---|
| JP | 2013-207646 A | | 10/2013 |
| JP | 2014-027249 A | | 2/2014 |
| JP | 2015-115671 A | | 6/2015 |
| JP | 2015115671 A | * | 6/2015 |
| KR | 10-2011-0134168 A | | 12/2011 |

* cited by examiner

SURFACE ACOUSTIC WAVE RESONATOR HAVING RING-SHAPED METAL SEALING CONFIGURATION

CROSS-REFERENCE TO RELATED APPLICATION

This application is based upon and claims the benefit of priority of the prior Japanese Patent Application No. 2016-229453, filed on Nov. 25, 2016, the entire contents of which are incorporated herein by reference.

FIELD

A certain aspect of the present invention relates to an electronic component and a method of fabricating the same.

BACKGROUND

Is has been known to mount a device chip on a substrate and seal the device chip by a metal sealing portion made of solder or the like and located in the periphery of the device chip in plan view. The following method has been known as a method of fabricating such an electronic component. A ring-shaped metal surrounding the device chip is located on the upper surface of the substrate. The metal sealing portion bonds with the ring-shaped metal layer, and the metal sealing portion thereby bonds with the upper surface of the substrate. A metal film protecting the metal sealing portion is formed on the side surfaces of the metal sealing portion and the ring-shaped metal layer as disclosed in, for example, Japanese Patent Application Publication No. 2014-27249.

However, when the adhesion between the side surface of the ring-shaped metal layer and the metal film is weak, the metal film peels from the ring-shaped metal layer. This prevents the metal film from properly protecting the metal sealing portion.

SUMMARY OF THE INVENTION

According to a first aspect of the present invention, there is provided an electronic component including: a substrate; a device chip that includes a functional element located on a lower surface thereof and is mounted on an upper surface of the substrate so that the functional element faces the upper surface of the substrate across an air gap; a ring-shaped metal layer that is located on the upper surface of the substrate and surrounds the device chip in plan view, a side surface of the ring-shaped metal layer being located further in than a side surface of the substrate; a metal sealing portion that surrounds the device chip in plan view and bonds with an upper surface of the ring-shaped metal layer, a side surface of the metal sealing portion being located further out than the side surface of the ring-shaped metal layer; and a metal film located on the side surface of the metal sealing portion and the side surface of the ring-shaped metal layer.

According to a second aspect of the present invention, there is provided a method of fabricating an electronic component, the method including: mounting a device chip including a functional element located on a lower surface thereof on an upper surface of a substrate so that the functional element and the upper surface of the substrate face each other across an air gap; forming a metal sealing portion that bonds with an upper surface of a ring-shaped metal layer, which is located on the upper surface of the substrate and surrounds the device chip in plan view, and surrounds the device chip; cutting the metal sealing portion and the ring-shaped metal layer; selectively etching a side surface of the ring-shaped metal layer relative to a side surface of the metal sealing portion; and forming a metal film on the side surface of the metal sealing portion and the side surface of the ring-shaped metal layer.

DETAILED DESCRIPTION

Hereinafter, a description will be given of embodiments of the present invention with reference to the accompanying drawings.

First Embodiment

Figure 1A:
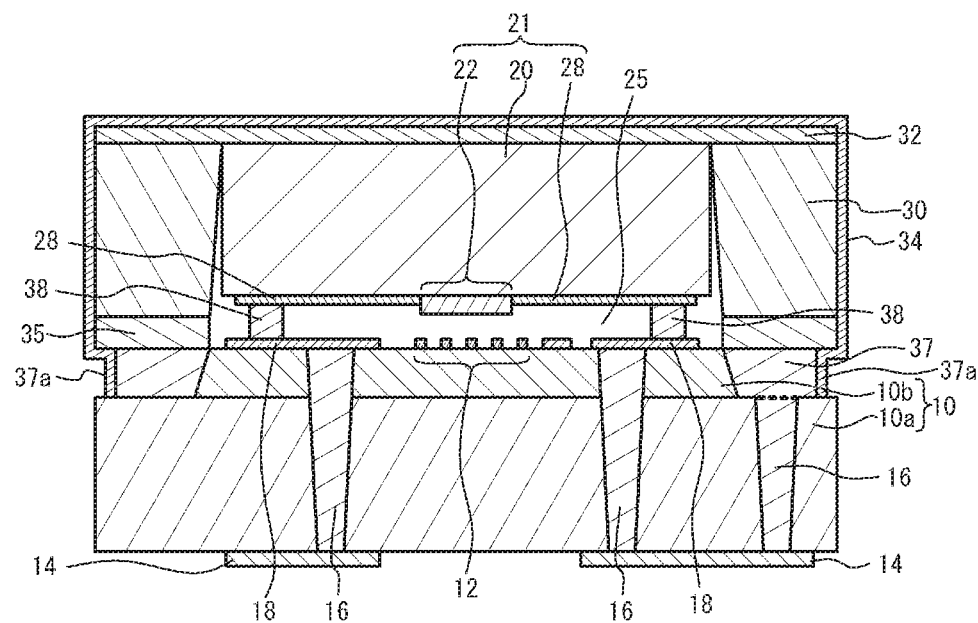
FIG. 1A and FIG. 1B are a cross-sectional view and a plan view of an electronic component in accordance with a first embodiment, respectively.
Figure 1B:
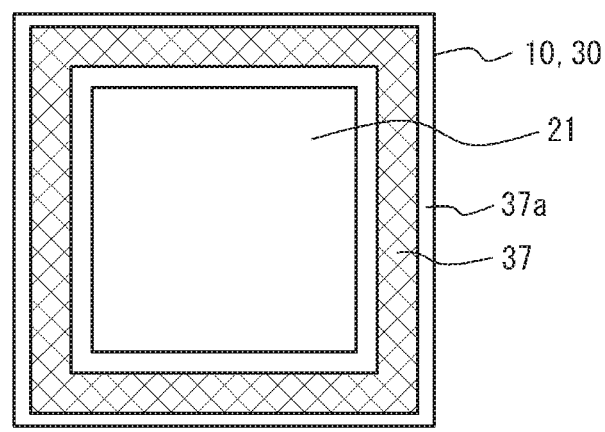

FIG. 1A and FIG. 1B are a cross-sectional view and a plan view of an electronic component in accordance with a first embodiment, respectively. FIG. 1B illustrates a substrate 10, a metal sealing portion 30, a device chip 21, and a ring-shaped metal layer 37. As illustrated in FIG. 1A, the substrate 10 includes a support substrate 10a and a piezoelectric substrate 10b. The support substrate 10a is, for example, a sapphire substrate, a spinel substrate, an alumina substrate, or a silicon substrate. The piezoelectric substrate 10b is, for example, a lithium tantalate substrate or a lithium niobate substrate. The piezoelectric substrate 10b is bonded on the upper surface of the support substrate 10a. The bonded surface of the piezoelectric substrate 10b and the support substrate 10a is a plane and flat.

Terminals 14 are located on the lower surface of the substrate 10. The terminals 14 are foot pads for connecting functional elements 12 and 22 with an external device. The functional element 12 and wiring lines 18 are located on the upper surface of the substrate 10. Via wirings 16 penetrating through the substrate 10 are provided. The terminals 14, the via wirings 16, and the wiring lines 18 are formed of, for example, a metal layer such as a copper layer, an aluminum layer, or a gold layer. The via wiring 16 electrically connects the wiring line 18 to the terminal 14. The ring-shaped metal layer 37 is located in the outer periphery of the upper surface of the substrate 10. A ring-shaped bonding layer 35 is located on the ring-shaped metal layer 37. The side surface of the ring-shaped metal layer 37 is located further in than the side surfaces of the substrate 10 and the metal sealing portion 30, and a recess portion 37a is formed on the side surface of the electronic component. The ring-shaped metal layer 37 is a metal layer such as a copper layer, a nickel layer, a gold layer, an aluminum layer, or a silver layer, or a multilayered film of at least two of them. The ring-shaped bonding layer 35 is a layer in which a nickel layer bonds with the metal sealing portion 30.

The device chip 21 includes a substrate 20 and the functional element 22. The functional element 22 and wiring lines 28 are located on the lower surface of the substrate 20. The substrate 20 is, for example, an insulating substrate such as a sapphire substrate, a spinel substrate, or an alumina substrate, or a semiconductor substrate such as a silicon substrate. The wiring line 28 is formed of, for example, a metal layer such as a copper layer, an aluminum layer, or a gold layer. The substrate 20 is flip-chip mounted (face-down mounted) on the substrate 10 through bumps 38. The bumps 38 are, for example, gold bumps, solder bumps, or copper bumps. The bump 38 bonds the wiring lines 28 and 18.

The metal sealing portion 30 is located on the substrate 10 so as to surround the device chip 21 in plan view. The metal sealing portion 30 is made of, for example, a metal material such as solder. The metal sealing portion 30 is bonded on the upper surface of the ring-shaped metal layer 37 through the ring-shaped bonding layer 35. A plate-like lid 32 is located on the upper surface of the substrate 20 and the upper surface of the metal sealing portion 30. The lid 32 is, for example, a metal plate or an insulating plate. A protective film 34 is located so as to cover the lid 32 and the metal sealing portion 30. The protective film 34 also covers the inner surface of the recess portion 37a. The protective film 34 is a metal film such as a nickel film, and has a melting point greater than the melting point of the metal sealing portion 30.

The functional elements 12 and 22 face each other across an air gap 25. The air gap 25 is sealed by the metal sealing portion 30, the substrate 10, the substrate 20, and the lid 32. The bumps 38 are surrounded by the air gap 25. The terminal 14 is electrically connected to the functional element 12 through the via wiring 16 and the wiring line 18. In addition, the terminal 14 is electrically connected to the functional element 22 through the via wiring 16, the wiring line 18, the bump 38, and the wiring line 28. The metal sealing portion 30 is grounded.

As illustrated in FIG. 1B, the ring-shaped metal layer 37 is located in the periphery of the substrate 10 and surrounds the device chip 21. The side surface of the ring-shaped metal layer 37 is located further in than the plane formed by the side surface of the substrate 10 and the side surface of the metal sealing portion 30. This structure forms the recess portion 37a that is a part of the side surface of the ring-shaped metal layer 37 dented from the side surface of the electronic component.

Figure 2A:
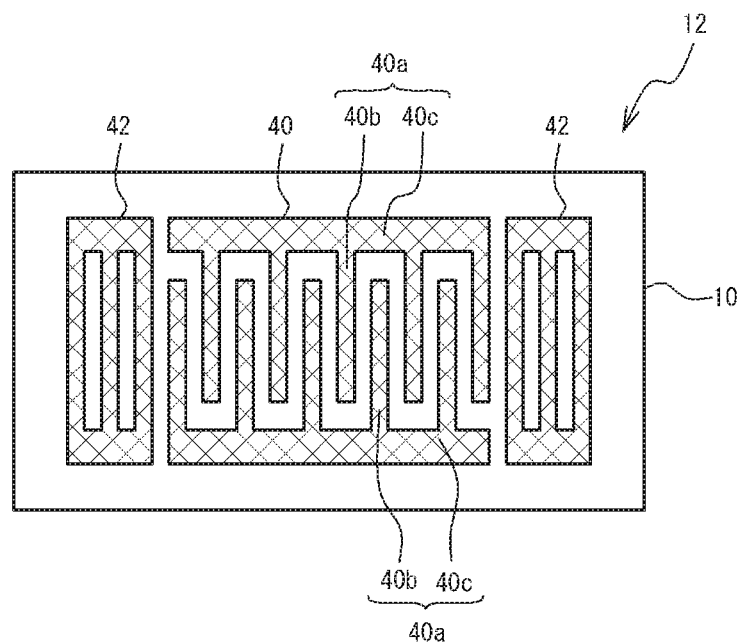
FIG. 2A is a plan view of a functional element.
Figure 2B:
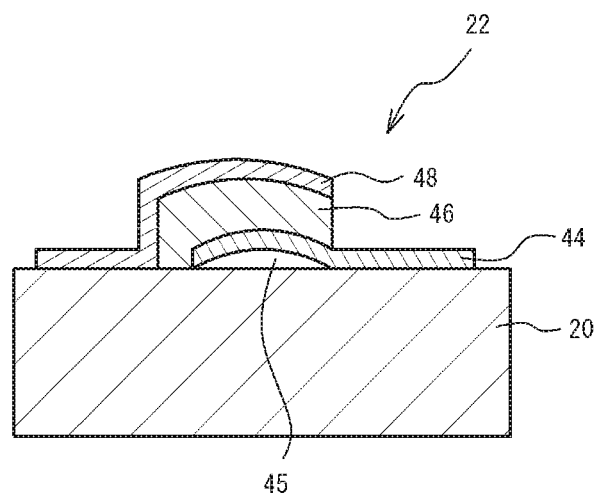
FIG. 2B is a cross-sectional view of another functional element.

FIG. 2A is a plan view of the functional element 12, and FIG. 2B is a cross-sectional view of the functional element 22. As illustrated in FIG. 2A, the functional element 12 is a surface acoustic wave resonator. An interdigital transducer (IDT) 40 and reflectors 42 are formed on the substrate 10. The IDT 40 includes a pair of comb-shaped electrodes 40a facing each other. The comb-shaped electrode 40a includes a plurality of electrode fingers 40b and a bus bar 40c to which the electrode fingers 40b are coupled. The reflectors 42 are located at both sides of the IDT 40. The IDT 40 excites a surface acoustic wave on the piezoelectric substrate 10b. The IDT 40 and the reflector 42 are formed of, for example, an aluminum film or a copper film. A protective film or a temperature compensation film covering the IDT 40 and the reflectors 42 may be provided. In this case, the surface acoustic wave resonator and the protective film or the temperature compensation film function as the functional element 12 as a whole.

As illustrated in FIG. 2B, the functional element 22 is a piezoelectric thin film resonator. A piezoelectric film 46 is located on the substrate 20. A lower electrode 44 and an upper electrode 48 are located so as to sandwich the piezoelectric film 46. An air gap 45 is formed between the lower electrode 44 and the substrate 20. The lower electrode 44 and the upper electrode 48 excite the acoustic wave in the thickness extension mode inside the piezoelectric film 46. The lower electrode 44 and the upper electrode 48 are formed of, for example, a metal film such as a ruthenium film. The piezoelectric film 46 is, for example, an aluminum nitride film.

The functional elements 12 and 22 include electrodes exciting the acoustic wave. Thus, the functional elements 12 and 22 are covered with the air gap 25 so as not to restrain the acoustic wave.

Hereinafter, the materials and dimensions of the first embodiment will be exemplified. The support substrate 10a is a sapphire substrate with a film thickness of 100 μm. The piezoelectric substrate 10b is a lithium tantalate substrate with a film thickness of 10 to 20 μm. When the support substrate 10a has a linear thermal expansion coefficient less than that of the piezoelectric substrate 10b, the frequency temperature dependence of the acoustic wave element of the functional element 12 is small. The via wirings are copper via wirings. The bumps 38 are gold bumps. The substrate 20 is a silicon substrate. The metal sealing portion 30 is made of SnAg solder. The lid 32 is a kovar plate with a film thickness of 15 μm. The protective film 34 is a nickel layer with a film thickness of 10 μm.

Fabrication Method of the First Embodiment

Figure 3A:
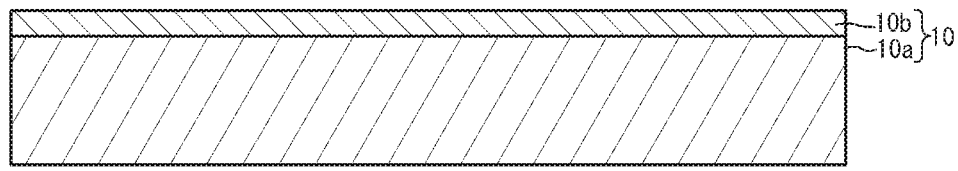
FIG. 3A through FIG. 3D are cross-sectional views (No. 1) illustrating a method of fabricating the electronic component in accordance with the first embodiment.

FIG. 3A through FIG. 6 are cross-sectional views illustrating a method of fabricating the electronic component in accordance with the first embodiment. As illustrated in FIG. 3A, the lower surface of the piezoelectric substrate 10b is bonded on the upper surface of the support substrate 10a. This bonding is conducted in a wafer state. Examples of the bonding method include a method that activates the upper surface of the support substrate 10a and the lower surface of the piezoelectric substrate 10b and then bonds them at normal temperature, and a method that bonds the substrates with an adhesive agent.

Figure 3B:
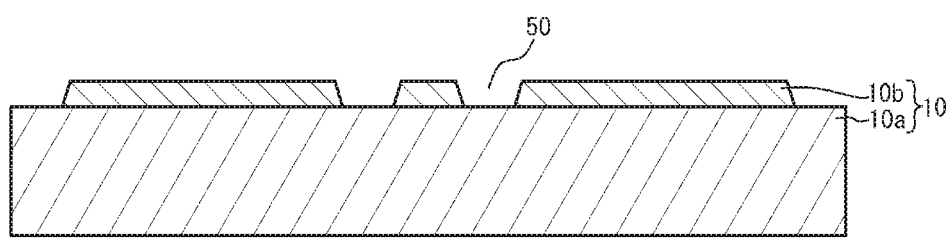

As illustrated in FIG. 3B, desired apertures 50 are formed on the piezoelectric substrate 10b. The apertures 50 are formed by, for example, blasting using a patterned photoresist as a mask. Instead of blasting, ion milling or wet etching may be used.

Figure 3C:
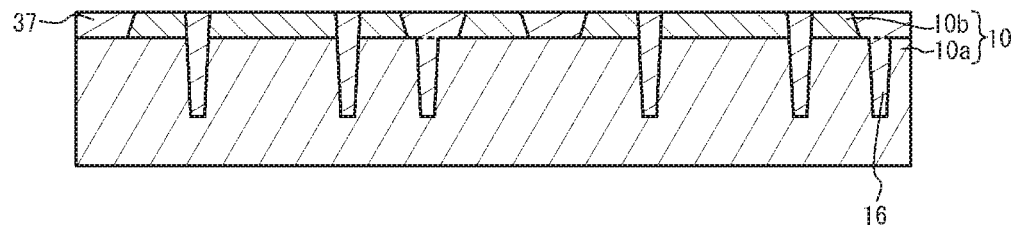

As illustrated in FIG. 3C, via holes are formed in the piezoelectric substrate 10b and the support substrate 10a. The via hole is formed by, for example, irradiating the substrates with a laser beam. Seed layers (not illustrated) are formed in the via holes and the apertures 50. An electric current is supplied to the seed layers to form the via wirings 16 in the via holes and the ring-shaped metal layers 37 in the apertures 50 by electrolytic plating. When the via wirings 16 and the ring-shaped metal layers 37 are formed of a copper layer, the seed layer is, for example, a titanium film with a film thickness of 100 µm and a copper layer with a film thickness of 200 µm stacked in this order from the substrate 10 side. An unnecessary plated layer is removed by chemical mechanical polishing (CMP) or the like.

Figure 3D:
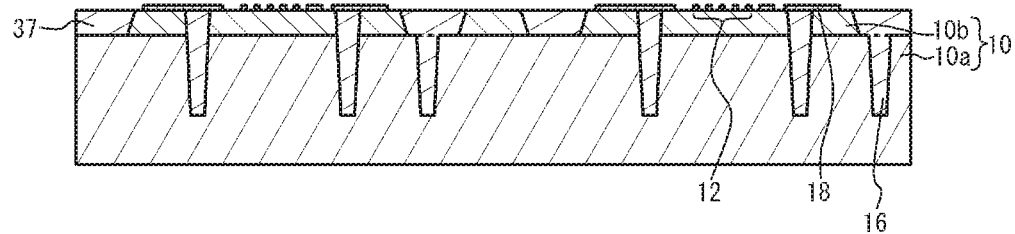

As illustrated in FIG. 3D, the functional elements 12 and the wiring lines 18 are formed on the upper surface of the piezoelectric substrate 10b. The functional element 12 is formed of, for example, a titanium film and an aluminum film stacked in this order from the substrate 10 side. The wiring line 18 is formed of, for example, a titanium film and a gold film stacked in this order from the substrate 10 side.

Figure 4A:
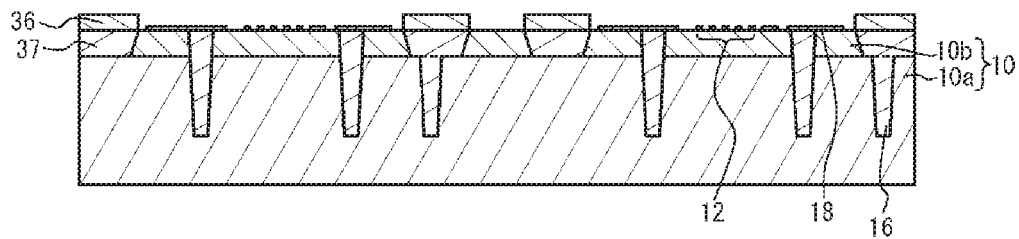
FIG. 4A through FIG. 4D are cross-sectional views (No. 2) illustrating the method of fabricating the electronic component in accordance with the first embodiment.
Figure 4B:
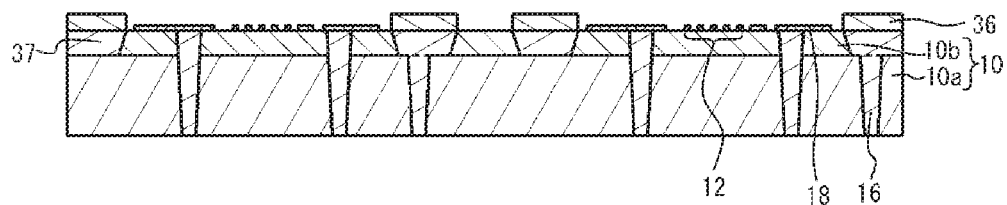

As illustrated in FIG. 4A, ring-shaped electrodes 36 are formed on the ring-shaped metal layers 37. The ring-shaped electrode 36 is formed of, for example, a titanium film and a nickel film stacked in this order from the substrate 10 side, and is formed by evaporation and liftoff. As illustrated in FIG. 4B, the lower surface of the substrate 10 is polished or ground. This process causes the via wiring 16 to be exposed from the lower surface of the substrate 10.

Figure 4C:
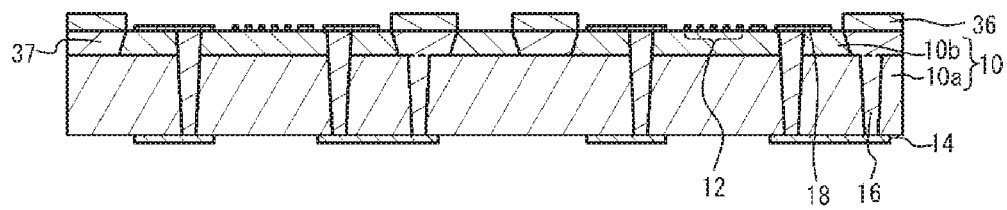

As illustrated in FIG. 4C, the terminals 14 are formed so as to be in contact with the via wirings 16. For example, a seed layer is formed on the lower surface of the substrate 10. A photoresist having apertures is formed under the seed layer. An electric current is supplied to the seed layer to form plated layers in the apertures by electrolytic plating. Then, the seed layer other than the plated layer is removed. The seed layer can be formed of, for example, a titanium film and a copper film stacked in this order from the substrate 10 side. The plated layer can be formed of, for example, a copper layer, a nickel layer, and a gold layer stacked in this order from the substrate 10 side.

Figure 4D:
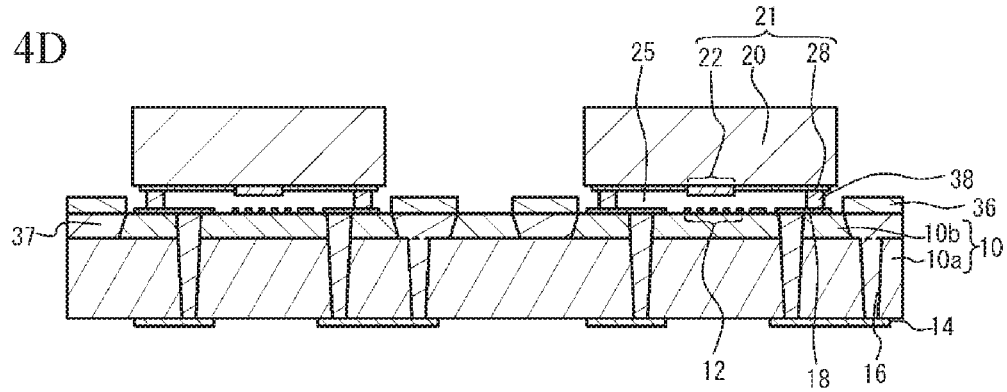

As illustrated in FIG. 4D, the substrates 20 are flip-chip mounted on the substrate 10. The substrates 20 are chips individually separated, and gold stud bumps as the bumps 38 are formed on the lower surface of the substrate 20.

Figure 5A:
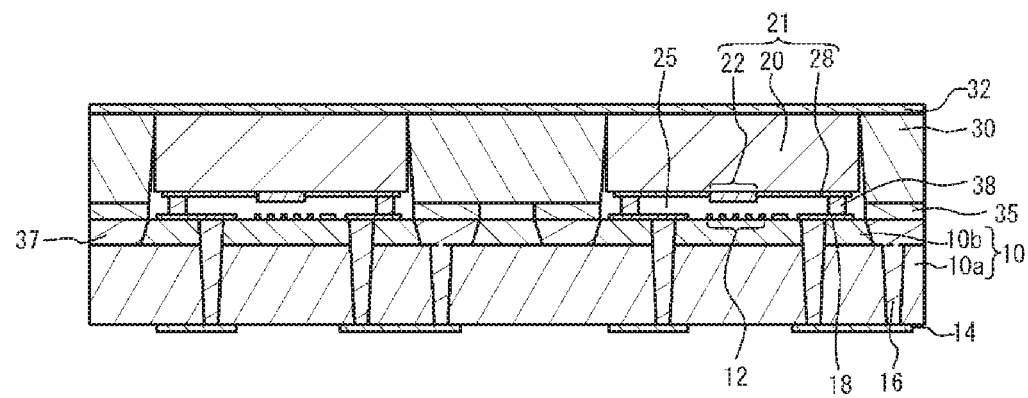
FIG. 5A through FIG. 5C are cross-sectional views (No. 3) illustrating the method of fabricating the electronic component in accordance with the first embodiment.

As illustrated in FIG. 5A, a solder plate is placed on the substrate 10 so as to cover the substrates 20. A lid 32 is placed on the solder plate. The solder plate is pressed against the substrate 10 with the lid 32, and heated to a temperature greater than the melting point of the solder plate. For example, the melting point of SnAg solder is approximately 220° C. In this case, the solder plate is heated to a temperature equal to or greater than 230° C. This process melts the solder plate, thereby forming the metal sealing portion 30. The metal sealing portion 30 forms the ring-shaped electrode 36 and alloy, and becomes the ring-shaped bonding layer 35. The metal sealing portion 30 and the ring-shaped metal layer 37 are bonded together through the ring-shaped bonding layer 35. Since the lid 32 has good solderability, the metal sealing portion 30 bonds with the lid 32. The lid 32 is in contact with the upper surface of the substrate 20, but does not bond with the upper surface of the substrate 20.

Figure 5B:
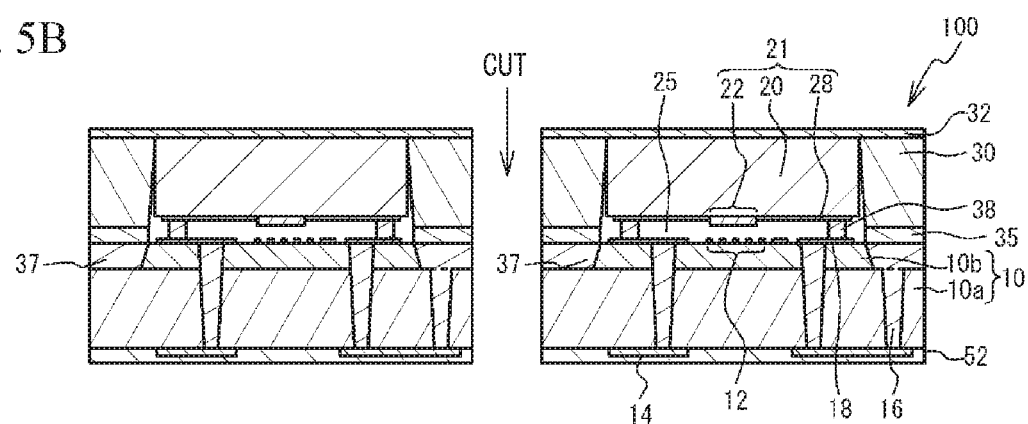

As illustrated in FIG. 5B, the lower surface of the substrate 10 is protected by a protective film 52 made of a photoresist. The lid 32, the metal sealing portion 30, and the ring-shaped metal layer 37 are cut. This process separates the individual electronic components 100. The cutting is conducted by, for example, dicing.

Figure 5C:
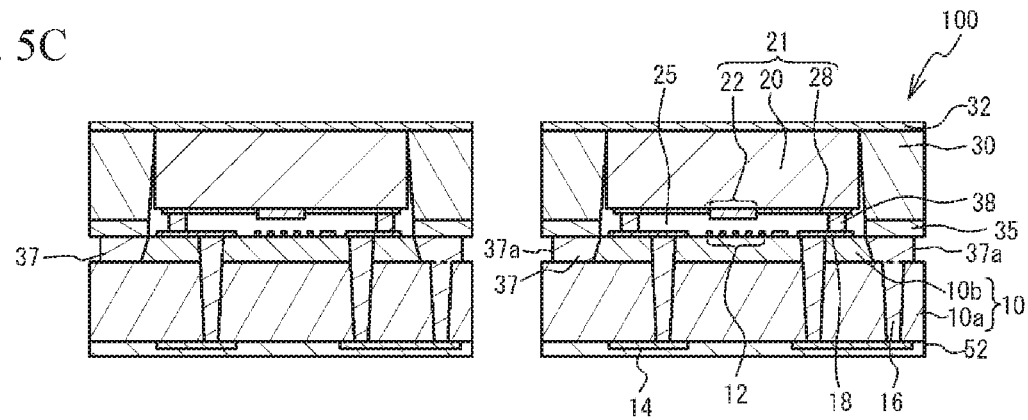

As illustrated in FIG. 5C, the side surface of the ring-shaped metal layer 37 is etched by using an etching agent that etches neither the substrate 10 nor the metal sealing portion 30 but etches the ring-shaped metal layer 37 of the side surface of the electronic component 100. This process forms the recess portion 37a on the side surface of the electronic component 100. For example, copper sulfate or nitric acid copper may be used as an etching liquid that does not etch solder of the metal sealing portion 30 but etches copper of the ring-shaped metal layer 37. The ring-shaped metal layer 37 may be etched in a barrel.

Figure 6:
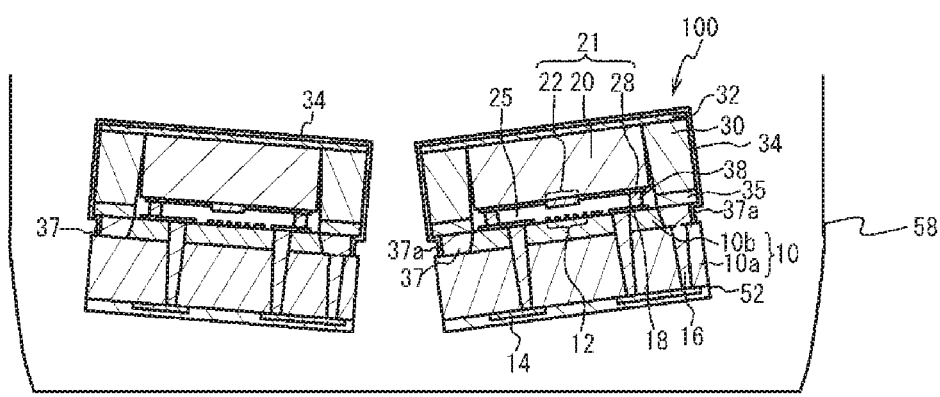
FIG. 6 is a cross-sectional view (No. 4) illustrating the method of fabricating the electronic component in accordance with the first embodiment.

As illustrated in FIG. 6, a plurality of the electronic components 100 are put into a barrel (not illustrated), and the barrel is put into a plating tank 58. The protective film 34 is formed by barrel plating. The protective film 34 is, for example, a nickel film with a film thickness of 10 µm. The protective film 34 is mainly formed on the surface of a metal material. Thus, the protective film 34 is formed on the upper surface of the lid 32, the side surface of the metal sealing portion 30, and the side surface of the ring-shaped metal layer 37, but is not formed on the side surface of the substrate 10 or the lower surface of the protective film 52. After the formation of the protective film 34, the protective film 52 is peeled. These processes complete the electronic component illustrated in FIG. 1A and FIG. 1B.

Figure 7A:
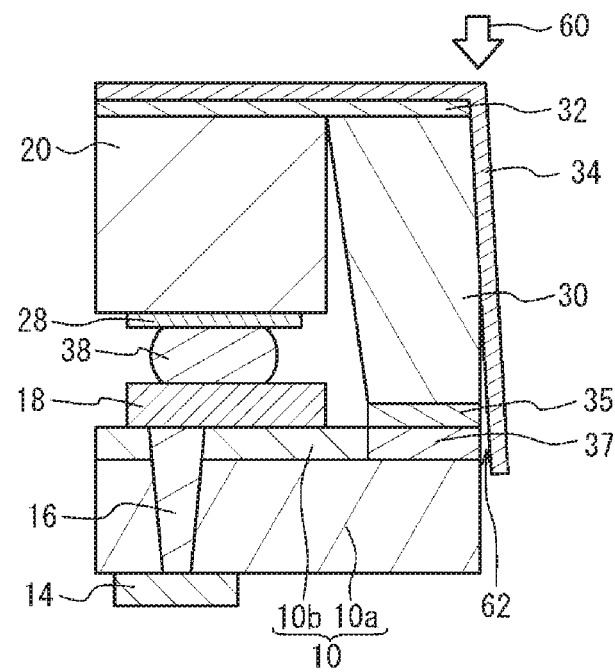
FIG. 7A and FIG. 7B are cross-sectional views of end portions in a first comparative example and the first embodiment, respectively.
Figure 7B:
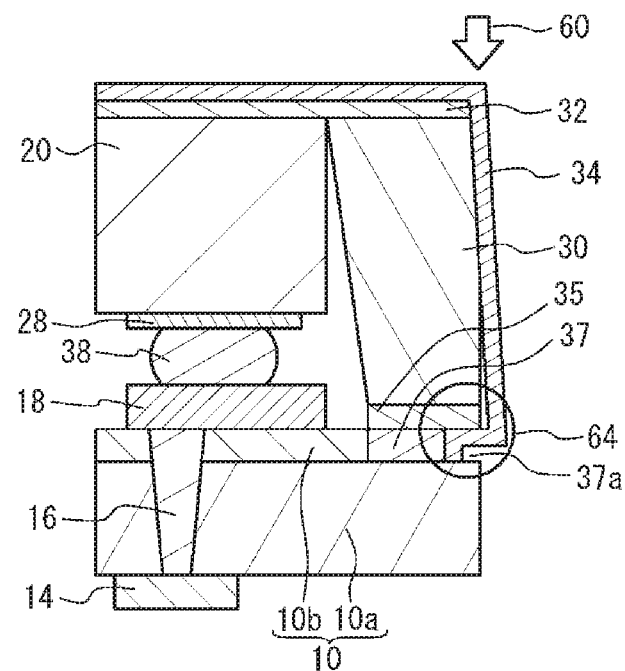

Advantages of the first embodiment will be described. FIG. 7A and FIG. 7B are cross-sectional views of end portions in a first comparative example and the first embodiment, respectively. As illustrated in FIG. 7A, in the first comparative example, the side surfaces of the substrate 10, the ring-shaped metal layer 37, and the metal sealing portion 30 substantially form a plane. In this structure, when a load 60 is applied downward from the vicinity of the periphery of the upper surface of the electronic component, the metal sealing portion 30 is compressed because the metal sealing portion is soft. Accordingly, a shear stress is generated in the protective film 34 and the ring-shaped metal layer 37. Thus, the protective film 34 peels from the side surfaces of the metal sealing portion 30 and the ring-shaped metal layer 37 (reference numeral 62). The protective film 34 has a function of protecting the ring-shaped metal layer 37. The protective film 34 inhibits the ring-shaped metal layer 37 from being deformed by, for example, reflow for mounting the electronic component on a printed board. The peeling of the protective film 34 from the ring-shaped metal layer 37 impairs the function as a protective film.

As illustrated in FIG. 7B, in the first embodiment, as indicated by a circle 64, the protective film 34 is formed in the recess portion 37a of the ring-shaped metal layer 37. Thanks to this structure, even when the protective film 34 peels from the metal sealing portion 30, the protective film 34 does not peel from the ring-shaped metal layer 37. Thus, the function as a protective film is not impaired.

Figure 8A:
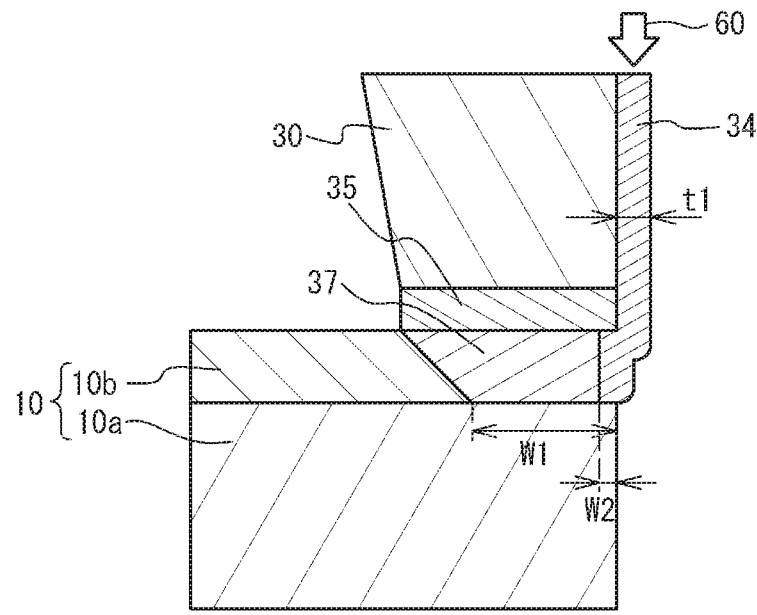
FIG. 8A and FIG. 8B are cross-sectional views illustrating the end portion in the first embodiment.
Figure 8B:
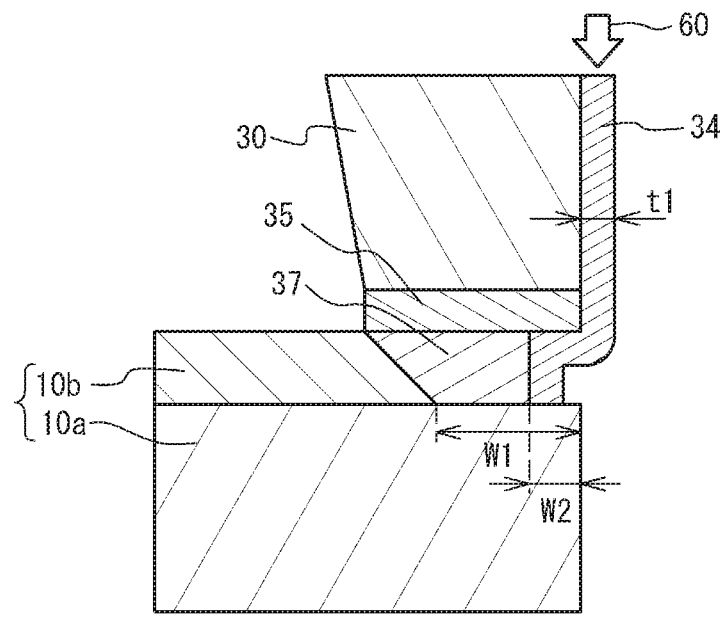

FIG. 8A and FIG. 8B are cross-sectional views illustrating the end portion in the first embodiment. As illustrated in FIG. 8A and FIG. 8B, the film thickness of the protective film 34 is represented by t1, the width of the lower surface of the ring-shaped metal layer 37 is represented by W1, and the width from the side surface of the substrate 10 to the side surface of the ring-shaped metal layer 37 is represented by W2. The width W1 of the ring-shaped metal layer 37 is, for example, 400 µm. The film thickness t1 of the protective film 34 is, for example, 10 µm. As illustrated in FIG. 8A, when the width W2 is 5 µm, approximately the half of the protective film 34 in the film thickness direction is formed on the substrate 10. This structure inhibits the protective film 34 from peeling in the part in which the protective film 34 is located on the surface of the substrate 10 even when the load 60 is applied. As illustrated in FIG. 8B, when the width W2 is 15 µm, the entire of the protective film 34 in the film thickness direction is formed on the substrate 10. In this structure, when the load 60 is applied, most of the stress of the protective film 34 is applied to the surface of the substrate 10. Accordingly, the peeling of the protective film 34 is further inhibited.

In the first embodiment, the side surface of the ring-shaped metal layer 37 is located further in than the side surface of the substrate 10. The side surface of the metal sealing portion 30 is located further out than the side surface of the ring-shaped metal layer 37. The protective film 34 (a metal film) is located on the side surfaces of the metal sealing portion 30 and the ring-shaped metal layer 37. This structure inhibits the peeling of the protective film 34 as illustrated in FIG. 7B.

As illustrated in FIG. 5B, in the first embodiment, the metal sealing portion 30 and the ring-shaped metal layer 37 are cut. As illustrated in FIG. 5C, the side surface of the ring-shaped metal layer 37 is selectively etched relative to the side surface of the metal sealing portion 30. Thereafter, as illustrated in FIG. 6, the protective film 34 is formed on the side surface of the metal sealing portion 30 and the side surface of the ring-shaped metal layer 37. These processes form the recess portion 37a.

The depth of the recess portion 37a (i.e., the distance between the side surface of the metal sealing portion 30 and the side surface of the ring-shaped metal layer 37) is greater than the film thickness of the protective film 34. Accordingly, as illustrated in FIG. 8B, the peeling of the protective film 34 is further inhibited.

The side surface of the metal sealing portion 30 and the side surface of the substrate 10 are substantially located in the same plane. This structure allows the metal sealing portion 30 and the substrate 10 to be cut at the same time.

The lid 32 is located on the device chip 21 and the upper surface of the metal sealing portion 30. This structure hermetically seals the functional element 22.

The substrate 10 includes the support substrate 10a and the piezoelectric substrate 10b bonded on the upper surface of the support substrate 10a, and the ring-shaped metal layer 37 is embedded in the piezoelectric substrate 10b. This structure prevents the ring-shaped metal layer 37 from protruding from the upper surface of the substrate 10 even when the ring-shaped metal layer 37 is formed thick. Thus, the degree of freedom of design is improved.

Figure 9:
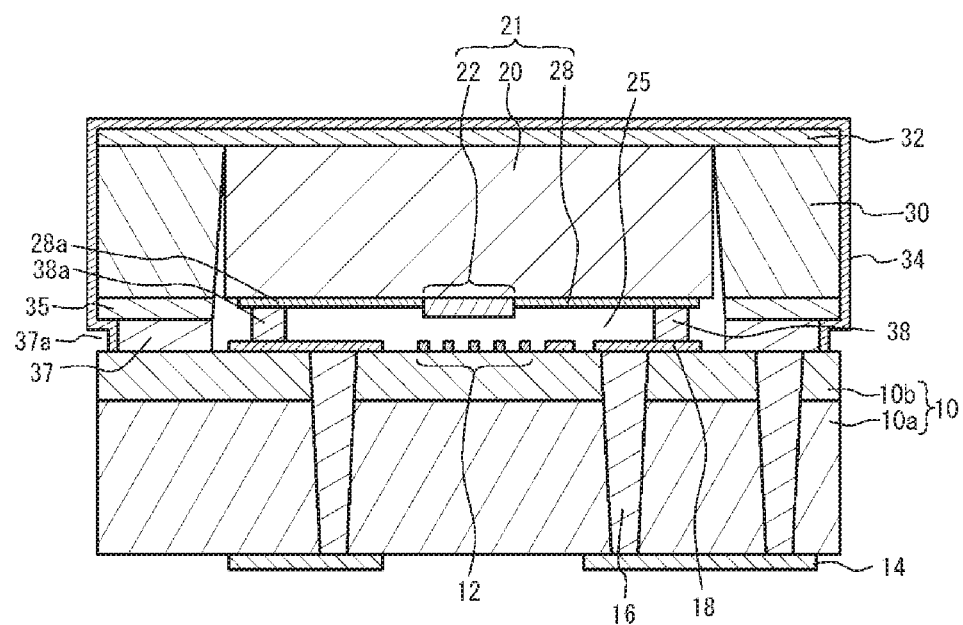
FIG. 9 is a cross-sectional view of an electronic component in accordance with a first variation of the first embodiment.

FIG. 9 is a cross-sectional view of an electronic component in accordance with a first variation of the first embodiment. As illustrated in FIG. 9, the ring-shaped metal layer 37 may be located on the piezoelectric substrate 10b.

Figure 10:
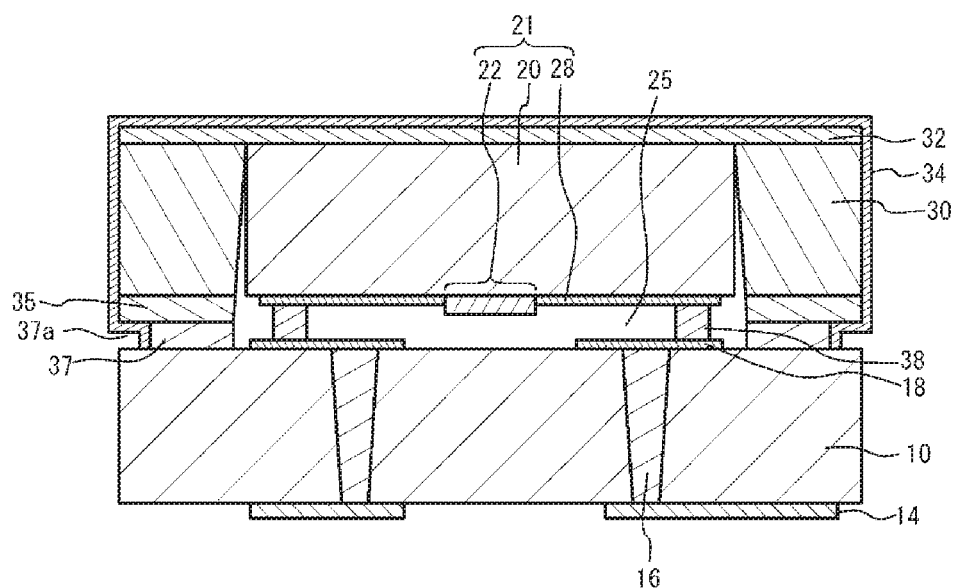
FIG. 10 is a cross-sectional view of an electronic component in accordance with a second variation of the first embodiment.

FIG. 10 is a cross-sectional view of an electronic component in accordance with a second variation of the first embodiment. As illustrated in FIG. 10, the substrate 10 may be an insulating substrate, and may not necessarily include the functional element 12 formed thereon. Examples of the insulating substrate includes a ceramic multilayered substrate made of high temperature co-fired ceramic (HTCC) or low temperature co-fired ceramic (LTCC), a sapphire substrate, a glass substrate, a HICERAM (registered trademark) substrate, or a resin substrate. Other structures are the same as those of the first embodiment, and the description thereof is thus omitted.

Figure 11:
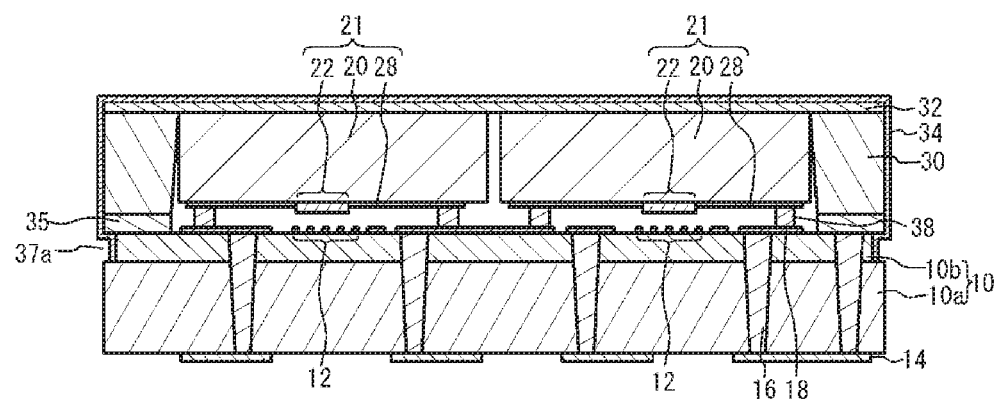
FIG. 11 is a cross-sectional view of an electronic component in accordance with a third variation of the first embodiment.

FIG. 11 is a cross-sectional view of an electronic component in accordance with a third variation of the first embodiment. As illustrated in FIG. 11, a plurality of the functional elements 12 are formed on the substrate 10. A plurality of the substrates 20 are mounted on the substrate 10. Other structures are the same as those of the first embodiment, and the description thereof is thus omitted.

Second Embodiment

Figure 12:
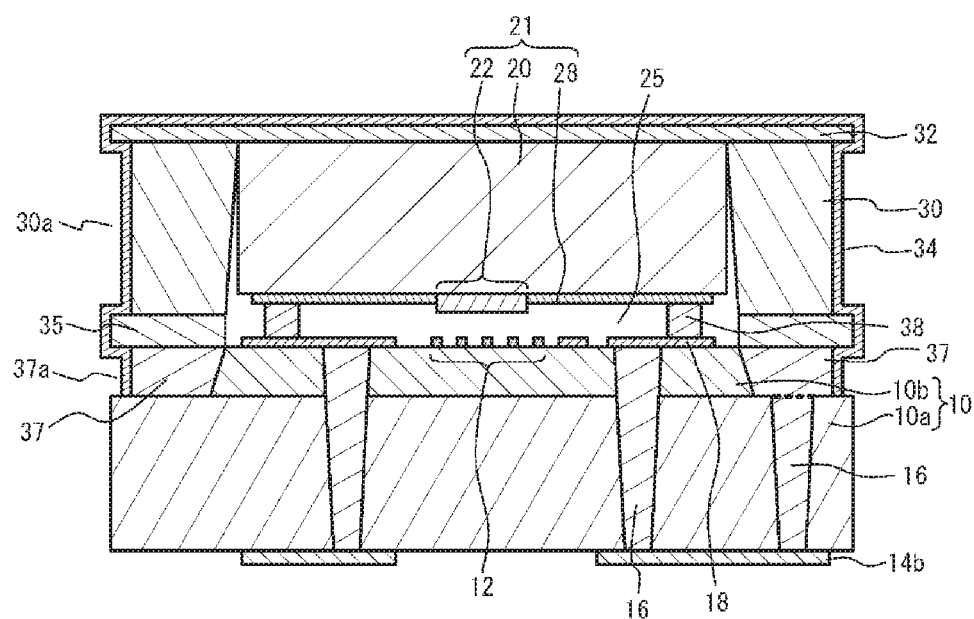
FIG. 12 is a cross-sectional view of an electronic component in accordance with a second embodiment.

FIG. 12 is a cross-sectional view of an electronic component in accordance with a second embodiment. As illustrated in FIG. 12, the side surface of the metal sealing portion 30 other than the ring-shaped bonding layer 35 is located further in than the side surface of the ring-shaped bonding layer 35. Other structures are the same as those of the first embodiment, and the description thereof is thus omitted. The second embodiment uses, for example, an acetic acid based etching liquid as an etching liquid in FIG. 5C. The acetic acid based etching liquid etches AgSn solder and copper, and hardly etches the ring-shaped bonding layer 35 including AgSn, Ni, and alloy. Thus, the electronic component of the third variation of the first embodiment illustrated in FIG. 11 is fabricated. The second embodiment may be applied to the first through third variations of the first embodiment.

Third Embodiment

Figure 13:
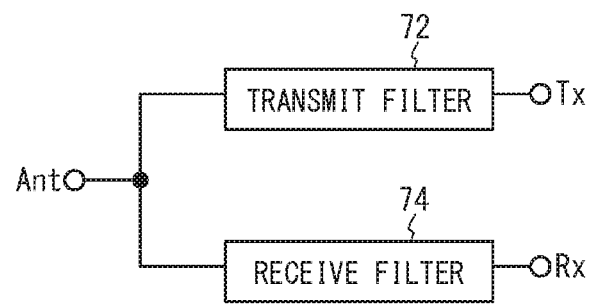
FIG. 13 is a circuit diagram of a duplexer in accordance with a third embodiment.

A third embodiment is an exemplary multiplexer such as a duplexer. FIG. 13 is a circuit diagram of a duplexer in accordance with the third embodiment. As illustrated in FIG. 13, a transmit filter 72 is connected between a common terminal Ant and a transmit terminal Tx. A receive filter 74 is connected between the common terminal Ant and a receive terminal Rx. The transmit filter 72 transmits signals in the transmit band to the common terminal Ant among high-frequency signals input from the transmit terminal Tx, and suppresses other signals. The receive filter 74 allows signals in the receive band to pass therethrough among high-frequency signals input to the common terminal Ant, and suppresses other signals.

The transmit filter 72 is formed of the functional element 22 of the first and second embodiments, and the receive filter 74 is formed of the functional element 12 of the first and second embodiments. This structure causes the electronic component of the first and second embodiments to function as a duplexer. A duplexer is described as an example of the multiplexer, but the multiplexer may be a triplexer or a quadplexer. For example, in the third variation of the first embodiment, a plurality of filters are formed on the substrate 10, and each filter may be formed in the device chip 21.

In the first and second embodiments and the variations thereof, both the functional elements 12 and 22 may be surface acoustic wave elements or piezoelectric thin film resonators. Alternatively, the functional element 12 may be a piezoelectric thin film resonator, and the functional element 22 may be a surface acoustic wave element. The functional elements 12 and 22 may be other than the acoustic wave element. For example, the functional element may be an active element such as an amplifier and/or a switch. Alternatively, the functional element may be a passive element such as an inductor and/or a capacitor.

Although the embodiments of the present invention have been described in detail, it is to be understood that the various change, substitutions, and alterations could be made hereto without departing from the spirit and scope of the invention.

What is claimed is:

1. An electronic component comprising:
    a substrate that is an insulating substrate;
    a device chip that includes a functional element located on a lower surface thereof and is mounted on an upper surface of the substrate so that the functional element faces the upper surface of the substrate across an air gap;
    a ring-shaped metal layer that is located on the upper surface of the substrate and surrounds the device chip in plan view, a side surface of the substrate protruding laterally beyond a side surface of the ring-shaped metal layer;

a metal sealing portion that surrounds the device chip in plan view and bonds with an upper surface of the ring-shaped metal layer, a side surface of the metal sealing portion protruding laterally beyond the side surface of the ring-shaped metal layer; and a metal film located on the side surface of the metal sealing portion and the side surface of the ring-shaped metal layer, wherein the metal film comes in contact with the side surface of the ring-shaped metal layer and an upper surface of the substrate at a side of the side surface of the ring-shaped metal layer.

2. The electronic component according to claim 1, wherein
a distance between the side surface of the metal sealing portion and the side surface of the ring-shaped metal layer is greater than a film thickness of the metal film.

3. The electronic component according to claim 1, wherein
the side surface of the metal sealing portion and the side surface of the substrate are located in a same plane.

4. The electronic component according to claim 1, wherein
the metal sealing portion includes a ring-shaped bonding layer between the metal sealing portion and the ring-shaped metal layer, the ring-shaped bonding layer bonding with the ring-shaped metal layer,
the side surface of the ring-shaped metal layer is located further in than a side surface of the ring-shaped bonding layer, and
a side surface of a part, of the metal sealing portion, other than the ring-shaped bonding layer is located further in than the side surface of the ring-shaped bonding layer.

5. The electronic component according to claim 1, further comprising
a lid located on the device chip and an upper surface of the metal sealing portion.

6. The electronic component according to claim 1, wherein
the substrate includes a support substrate and a piezoelectric substrate bonded on an upper surface of the support substrate, and
the ring-shaped metal layer is embedded in the piezoelectric substrate.

7. The electronic component according to claim 1, wherein
the ring-shaped metal layer is a copper layer,
the metal film is a nickel layer, and
the metal sealing portion is a solder layer.

8. The electronic component according to claim 1, wherein
the functional element is an acoustic wave element.

* * * * *